United States Patent
Arakawa et al.

(10) Patent No.: US 7,642,469 B2
(45) Date of Patent: *Jan. 5, 2010

(54) ELECTROMAGNETIC SHIELDING SHEET

(75) Inventors: Fumihiro Arakawa, Shinjuku-Ku (JP);
Yasuhiko Ishii, Shinjuku-Ku (JP);
Daisuke Hashimoto, Shinjuku-Ku (JP);
Yukihiro Kyoden, Shinjuku-Ku (JP);
Eiji Ohishi, Shinjuku-Ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 644 days.

This patent is subject to a terminal disclaimer.

(21) Appl. No.: 10/519,935

(22) PCT Filed: Aug. 8, 2003

(86) PCT No.: PCT/JP03/10172

§ 371 (c)(1),
(2), (4) Date: Dec. 29, 2004

(87) PCT Pub. No.: WO2004/016061

PCT Pub. Date: Feb. 19, 2004

(65) Prior Publication Data

US 2005/0244608 A1 Nov. 3, 2005

(30) Foreign Application Priority Data

Aug. 8, 2002 (JP) ............................. 2002-230843

(51) Int. Cl.
*H05K 9/00* (2006.01)
(52) U.S. Cl. .................. 174/381; 174/389; 174/392; 313/479

(58) Field of Classification Search ................. 174/389, 174/392, 381; 313/313, 479
See application file for complete search history.

(56) References Cited

U.S. PATENT DOCUMENTS

| 6,054,647 A * | 4/2000 | Ridener ....................... 174/392 |
| 6,448,492 B1 | 9/2002 | Okada et al. |
| 2004/0074655 A1* | 4/2004 | Takahashi et al. ...... 174/35 MS |

FOREIGN PATENT DOCUMENTS

| EP | 0 917 174 A2 | 5/1999 |
| JP | 10-075087 | 3/1998 |
| JP | 11-186785 | 7/1999 |
| JP | 2000-137441 | 5/2000 |
| JP | 2000-286594 | 10/2000 |
| JP | A-2000-286594 A | 10/2000 |

(Continued)

*Primary Examiner*—Hung V Ngo
(74) *Attorney, Agent, or Firm*—Oliff & Berridge, PLC (57) ABSTRACT

An electromagnetic shielding sheet is capable of shielding electromagnetic radiation generated by a display, has a proper transparency and uniformly distributed meshes, prevents the occurrence of white and/or black spot defects and linear defects and glaring, and ensures the satisfactory visibility of images. The electromagnetic shielding sheet has a conductive structure (109) having lines (107) having straight parts of widths (W) in the range of C(1±30%), where C is a predetermined value. The radius (r) of curvature of a side surface (107S) extending between the upper side (107U) and the lower side (107B) of a bank in a section of the lines (107) in a plane perpendicular to the transparent sheet meet a condition expressed by: $1.5t \leq r \leq 3.0t$, where t is the thickness of the conductive structure (109).

24 Claims, 3 Drawing Sheets

FOREIGN PATENT DOCUMENTS

| | | |
|---|---|---|
| JP | 2001-168574 | 6/2001 |
| JP | 2002-190692 | 7/2002 |
| JP | 2002-368482 | 12/2002 |
| TW | 401733 | 11/2000 |
| TW | 485750 | 1/2002 |

\* cited by examiner

ELECTROMAGNETIC SHIELDING SHEET

TECHNICAL FIELD

The present invention relates to a sheet for shielding electromagnetic radiation and, more specifically, to an electromagnetic shielding sheet provided with a meshed, thin metal layer (film) film, intended to be disposed in front of a display, such as a cathode-ray tube (CRT) or a plasma display panel (PDP), to shield electromagnetic radiation generated by the display, and capable of enabling the satisfactory visual recognition of images displayed by the display.

BACKGROUND ART

Summary of Techniques: Troubles attributable to electromagnetic inference (EMI) have increased with the recent functional progress and spread of electric and electronic devices. Electromagnetic noises are classified roughly into conducted noises and radiated noises. Methods of preventing troubles due to conducted noises filter conducted noises by a noise filter. Methods of preventing troubles due to radiated noises use a metal case to shield a space electromagnetically, places a metal sheet between wiring boards or coat the wires of cables with a metal foil. Although effective in electromagnetically shielding circuits and power blocks, these methods are unsuitable for shielding electromagnetic radiation generated by the screens of displays, such as CRTs and PDPs because those methods use opaque means.

The PDP is an assembly of a glass panel provided with data electrodes and a fluorescent layer, and a glass panel provided with transparent electrodes. The PDP generates a large amount of electromagnetic radiation, a large amount of near-infrared radiation and a large amount of heat when operated. Usually, a front panel is disposed in front of the PDP to shield electromagnetic radiation. The front panel must have a shielding function of 30 dB or above in the range of 30 MHz to 1 GHz to shield electromagnetic radiation emitted from the screen of the display. Infrared radiation of wavelengths in the range of 800 to 1,100 nm radiated from the screen of the display must be shielded because infrared radiation makes other devices, such as VTRs, malfunction. The electromagnetic shielding metal mesh (lines) of the electromagnetic shielding sheet must be invisible to facilitate the observation of images displayed on the screen of the display, and the electromagnetic shielding sheet must have proper transparency (visible light transmitting property, visible light transmittance) to make images displayed by the display satisfactorily visible.

Since the PDP is provided with a large screen, such as a 37 in. screen, a 42 in. screen or a greater one, the electromagnetic shielding sheet used in combination with the PDP has thousands of horizontal and vertical lines. The widths of the lines must be within a predetermined width range. If the widths of the lines are distributed in a wide range, black and white spots are formed in a displayed image, which makes a viewer feel a feeling of wrongness.

Prior Art: To ensure improved visibility of displayed images, the front panel is required to have an electromagnetic shielding ability, proper transparency (visible light transmittance), and a uniform, meshed structure capable of electromagnetic shielding.

A front panel having a meshed structure disclosed in JP 5-283889 A has a structure: (base)/(transparent anchor layer)/(electromagnetic shielding layer). The electromagnetic shielding layer has a meshed pattern and is formed by an electroless plating process. A method of forming a metal mesh for an electromagnetic shielding sheet disclosed in JP 09-293989 A uses a photoresist process. An electromagnetic shielding structure disclosed in JP 10-335885 A is formed by laminating a plastic film provided with a copper foil formed in a geometrical pattern by photolithography to a plastic plate. All of those prior art methods mention nothing about the accuracy of the width of the lines of the meshed structure and the influence of the accuracy of the width.

A method of fabricating an electromagnetic shielding sheet disclosed in JP 11-186785 forms lines on a transparent base such that the area of a section of each line in a plane parallel to the transparent base decreases with the distance from the transparent base; that is, the lines has a trapezoidal section in a plane perpendicular to the transparent base. However, the prior art mentions nothing about the distribution of the widths of the lines. Since this method performs overetching or interrupts etching, the control of the accuracy of the width of the lines is very difficult. The lines having widths distributed in a wide range cause irregular image density, have a bad appearance, form black and white spot defects and linear defects in images and deteriorate the visibility of images.

DISCLOSURE OF THE INVENTION

The present invention has been made to solve those problems and it is therefore an object of the present invention to provide an electromagnetic shielding sheet disposed in front of a display, such as a CRT or a PDP, capable of shielding electromagnetic radiation, and capable of ensuring the high visibility of displayed images, controlling the formation of black and white spot defects and linear defects.

An electromagnetic shielding sheet according to a first aspect of the present invention includes a transparent base, and a meshed conductive structure laminated to one of the surfaces of the transparent base; wherein the conductive structure has lines having straight parts of a width in the range of $C (1\pm30\%)$, where C is a predetermined value. The electromagnetic shielding sheet of the present invention shields electromagnetic radiation generated by a display, such as a CRT or a PDP, the has the meshed conductive structure having invisible lines, has both an electromagnetic shielding ability and a high transparency, has the lines of widths within the predetermined range, has the uniform meshes distributed uniformly, and ensures the satisfactory visibility of displayed images.

An electromagnetic shielding sheet according to a second aspect of the present invention includes a transparent base, and a meshed conductive structure laminated to one of the surfaces of the transparent base; wherein the radius of curvature of a side surface extending between the upper and the lower side of a bank in a section of the lines in a plane perpendicular to the transparent sheet is in the range of 1.5 to 3.0 times the thickness of the conductive structure. The electromagnetic shielding sheet of the present invention is disposed in front of a display, such as a CRT or a PDP, shields electromagnetic radiation generated by the display, does not glare, and ensures the satisfactory visibility of displayed images.

An electromagnetic shielding sheet according to a third aspect of the present invention includes a transparent base, and a meshed conductive structure laminated to one of the surfaces of the transparent base; wherein the conductive structure has lines having straight parts of a width in the range of $C (1\pm30\%)$, where C is a predetermined value, and the radius of curvature of a side surface extending between the upper and the lower side of a bank in a section of the lines in a plane perpendicular to the transparent sheet is in the range of 1.5 to 3.0 times the thickness of the conductive structure. The electromagnetic shielding sheet of the present invention is disposed in front of a display, such as a CRT or a PDP, shields electromagnetic radiation generated by the display, have uniform meshes distributed uniformly, ensures the satisfactory visibility of displayed images, scarcely has black and white spot defects and linear defects, and does not glare.

In the electromagnetic shielding sheet of the present invention, the widths of the straight parts of the lines in an inner part of the meshed conductive structure surrounded by a peripheral part of a width corresponding to 1 to 50 meshes or a peripheral part of a width in the range of 0.15 to 15 mm are in the range of C (1±30%), where C is a predetermined value. In the electromagnetic shielding sheet of the present invention, the widths of the straight parts of the lines of the conductive structure are in the range of 5 to 25 μm, and the lines are arranged at pitches in the range of 150 to 500 μm. The electromagnetic shielding sheet of the present invention even having a large area is resistant to bending and creasing.

In the electromagnetic shielding sheet of the present invention, the conductive structure is a metal layer. In the electromagnetic shielding sheet of the present invention, at least one of the surfaces of the conductive structure is processed by a blackening treatment. In the electromagnetic shielding sheet of the present invention, an antirust layer is formed at least on the surface, processed by the blackening treatment, of the conductive structure. The electromagnetic shielding sheet of the present invention has an excellent electromagnetic shielding ability, ensures satisfactory visibility of displayed images, and resistant to rusting.

In the electromagnetic shielding sheet of the present invention, at least recesses in the meshed conductive structure are filled up with a transparent resin such that the surface of the conductive structure is substantially flat. The recesses in the conductive structure of the electromagnetic shielding sheet are filled up with the transparent resin to improve the workability of the electromagnetic shielding sheet.

In the electromagnetic shielding sheet of the present invention, the transparent resin filling up the recesses in the meshed conductive structure to substantially flatten the surface of the conductive structure contains a color tone correcting light-absorbing agent capable of absorbing visible light having wavelengths between 570 and 605 nm and/or a near-infrared absorbing agent capable of absorbing infrared radiation having wavelengths between 800 and 1100 nm. The electromagnetic shielding sheet of the present invention further includes a layer containing a color tone correcting light-absorbing agent capable of absorbing visible light having wavelengths between 570 and 605 nm and/or a layer containing a near-infrared absorbing agent capable of absorbing infrared radiation having wavelengths between 800 and 1100 nm formed on at least one of the surfaces of the conductive structure. The electromagnetic shielding sheet of the present invention is capable of shielding near-infrared radiation, infrared radiation and electromagnetic radiation generated by the display, such as a PDP, and of improving the visibility of images displayed by the display by absorbing light rays of unnecessary colors for color correction.

BEST MODE FOR CARRYING OUT THE INVENTION

A preferred embodiment of the present invention will be described with reference to the accompanying drawings. The present invention is not limited in its practical application to the embodiment specifically described herein.

Figure 1:
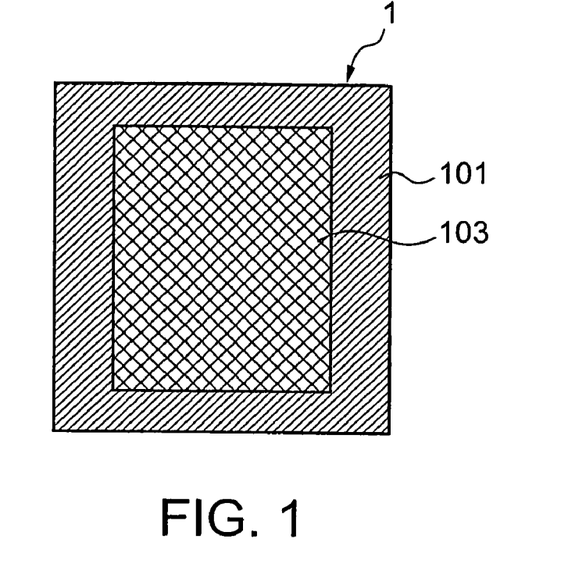
FIG. 1 is a plan view of an electromagnetic shielding sheet according to the present invention.

FIG. 1 is a plan view of an electromagnetic shielding sheet according to the present invention.

Figure 2:
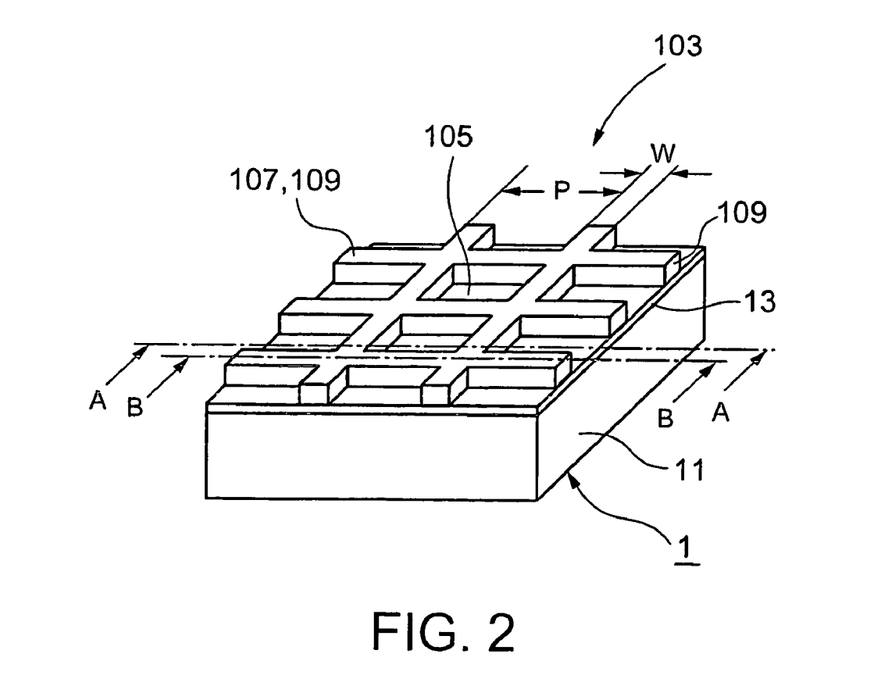
FIG. 2 is a partial, typical perspective view of the electromagnetic shielding sheet according to the present invention.

FIG. 2 is a partial, typical perspective view of the electromagnetic shielding sheet according to the present invention.

General Construction: Referring to FIG. 1, an electromagnetic shielding sheet 1 according to the present invention has a meshed structure 103 and a grounding frame 101. As shown in FIG. 2, the meshed structure 103 has intersecting lines 107 defining openings (cells) 105. The grounding frame 101 is connected to a ground when the electromagnetic shielding sheet 1 is combined with a display.

A conductive structure 109 is laminated to one surface of a base 11 with an adhesive layer 13. The conductive structure 109 is a meshed structure having the lines 107 defining the densely arranged openings 105. As shown in FIG. 2, the width of the lines 107 is referred to as line width W, and the distance between the similar edges of the adjacent lines 107 is referred to as pitch P.

Figure 3A:
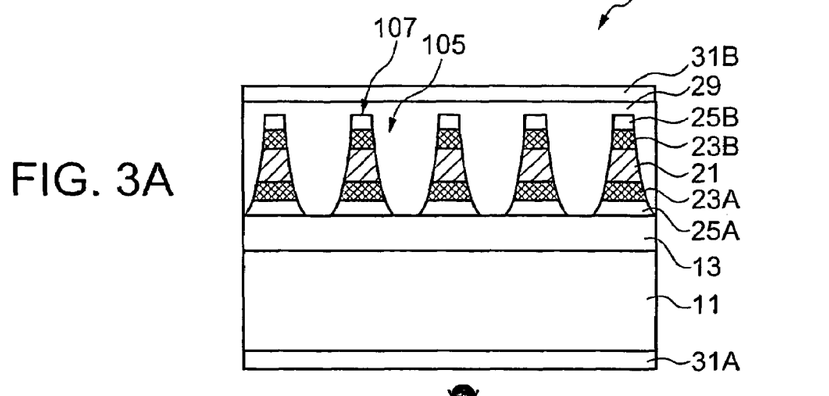
FIG. 3A is a sectional view taken on the line A-A in FIG. 2.
Figure 3B:
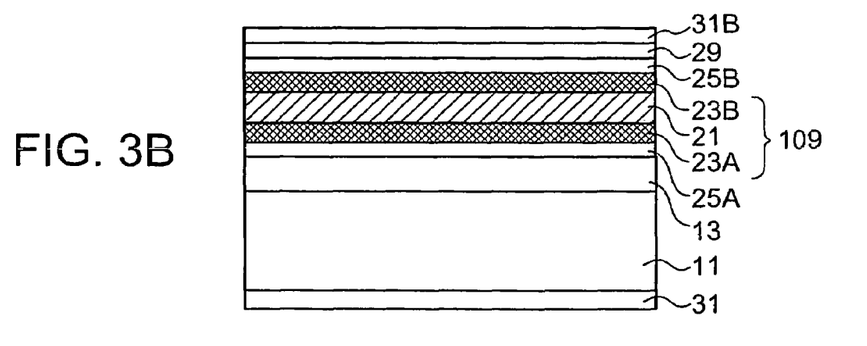
FIG. 3B is a sectional view taken on the line B-B in FIG. 2.
Figure 4:
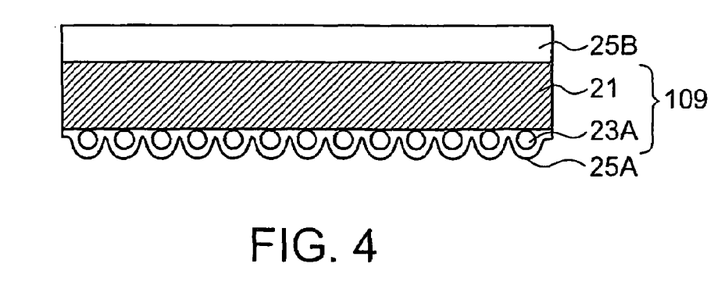
FIG. 4 is a sectional view of assistance in explaining the construction of a conductive structure.

FIGS. 3A and 3B are sectional views taken on the lines A-A and B-B in FIG. 2, respectively, and FIG. 4 is a sectional view of assistance in explaining the construction of the conductive structure.

Construction of Conductive Structure: As shown in FIG. 3A showing a section in a plane crossing the openings 105, the openings 105 and the lines 107 are arranged alternately. As shown in FIG. 3B showing a section in a plane including the line 107, the continuous line 107 is formed from the conductive structure 109. The conductive structure 109 may be a conductive layer, preferably, a metal layer 21. When necessary, at least a blackened layer 23A or 23B is formed on a surface of the metal layer 21 facing a viewing side. The conductive structure 109 has an antirust layer 25A and/or an antirust layer 25B formed on the blackened layer 23A and/or the blackened layer 23B. An antirust layer may be formed at least on the blackened layer. The antirust layers 25A and 25B prevent the metal layer 21 and the blackened layers 23A and 23B from rusting, and prevent the blackened layers 23A and 23B from coming off. First Point of the Invention: The width W of straight parts of the lines 107 included in the meshed structure 103 is in the range of C(1±30%), where C is a predetermined value. Thus, errors in the widths W of the straight parts of the lines 107 in the meshed structure 103 are within C×30%. When the widths W of the lines 107 are within the range C(1±30%), the electromagnetic shielding sheet 1 has an electromagnetic shielding ability and a proper transparency, the meshes are uniformly distributed and, and the visibility of images is excellent. Preferably, the line widths W of the lines 107 in the meshed structure 103 are in the range of 5 to 25 μm, and the pitches P of the lines 107 are in the range of 150 to 500 μm.

Figure 7:
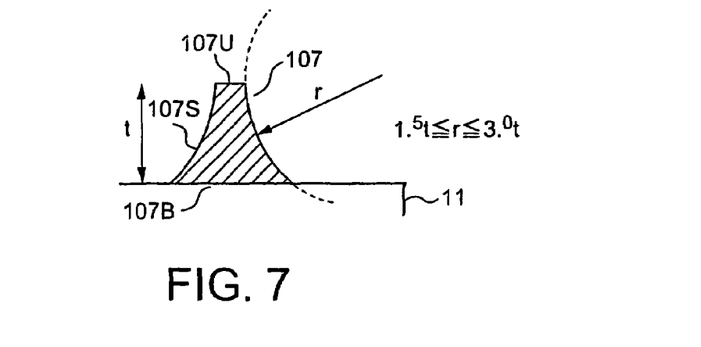
FIG. 7 is a sectional view of assistance in explaining the shape of a section of a straight part of a line included in a meshed structure, in which the radius r of curvature of a side surface 107S extending between an upper side 107U and a lower side 107B of a section of the straight part in a plane perpendicular to the surface of a transparent base meets a condition expressed by $1.5t \leq r \leq 3.0t$, where t is the thickness of the metal layer.

Second Point of the Invention: As shown in FIGS. 3A and 7, the radius r of curvature of a side surface 107S extending between an upper side 107U and a lower side 107B of a section of the straight part in a plane perpendicular to the surface of a transparent base meets a condition expressed by $1.5t \leq r \leq 3.0t$, where t is the thickness of the metal layer. When lines 107 are formed such that the radius r of curvature of the side surface 107S extending between the upper side 107U and the lower side 107B of a section of the straight part of the lines 107 meets the foregoing condition, the electromagnetic shielding sheet has an electromagnetic shielding ability and a proper transparency, emitted light does not glare, the reflection of external light is suppressed and the visibility of images is excellent.

Third Point of the Invention: The meshed conductive structure has the lines of a width in the range of C(1±30%), where C is a predetermined value, and the radius of curvature of the side surface extending between the upper and the lower side of a bank in a section of the lines in a plane perpendicular to the transparent base is in the range of 1.5 to 3.0 times the thickness of the metal layer. When the lines are formed in widths within the predetermined range and the lines are formed such that the radius of curvature of the side surface extending between the upper side and the lower side of a section of the straight part of the lines meets the foregoing condition, the electromagnetic shielding sheet has an electromagnetic shielding ability and a proper transparency, the meshes are distributed uniformly, only few black and white spot defects and linear defects occur, emitted light does not glare, the reflection of external light is suppressed and the visibility of images is excellent.

Although the electromagnetic shielding sheet of the present invention is described as used principally in combination with a display, such as a CRT or a PDP, naturally, the electromagnetic shielding sheet of the present invention can be applied to shielding electromagnetic radiation emitted by devices other than the display.

The PDP is featured by its large screen. The dimensions of the electromagnetic shielding sheet are on the order of 620 mm×830 mm for a 37 in. screen, and on the order of 580 mm×980 for a 42 in. screen. The electromagnetic shielding sheet can be formed in greater dimensions. Usually, the respective numbers of the horizontal and the vertical lines of the electromagnetic shielding sheet are several thousands. The lines must be formed in a predetermined region in the line width W in an accuracy on the order of micrometers. A person viewing images displayed by the display feel a feeling of very strong wrongness if black and white spots are formed in the images. Excessively wide lines form black spot defects and excessively narrow lines form white spot defects. In the electromagnetic shielding sheet of the present invention, the distribution of the line widths and/or the shape of the section of the lines are controlled. Therefore, meshes are distributed uniformly, the number of black spot defects and/or the number of white spot defects is very small and the visibility of images is excellent.

In the conductive structure 109 of the electromagnetic shielding sheet of the present invention, The blackened layer 23A and/or the blackened layer 23B is formed at least on one of the surfaces of the metal layer 21, and the antirust layer 25A and/or the antirust layer 25B is formed at leased on the blackened layer 23A and/or the blackened layer 23B.

The conductive structure 109 is laminated to the base 11, i.e., a transparent film, with an adhesive, and then the conductive structure 109 is subjected to a photolithographic process to form a meshed structure. When necessary, the surface on the side of the metal layer is flattened. When necessary, a light-absorbing layer capable of absorbing visible radiation having specific wavelengths and/or near-infrared radiation is formed. When the electromagnetic shielding sheet thus formed and having a proper transparency is disposed in front of a display, electromagnetic radiation generated by the display is shielded, meshes are distributed uniformly, only few black or white spot defects are formed, and displayed images can be viewed in satisfactory visibility.

Fabricating Method: In fabricating the electromagnetic shielding sheet 1 of the present invention, the conductive structure 109 provided at least with the blackened layer and the antirust layer on the viewing side is fabricated. The conductive structure 109 is laminated to one of the surfaces of the base 11, i.e., a transparent film, with the adhesive, and a resist film having a meshed pattern is formed over the conductive structure 109. A photolithographic process is carried out to remove parts of the conductive structure 109 not coated with the resist film by etching and then the resist film is removed. The electromagnetic shielding sheet can be fabricated by existing fabricating apparatuses and most of the processes can be successively carried out. Thus, the electromagnetic shielding sheet can be fabricated in a high quality at a high yield rate and at a high production efficiency.

Materials of and methods of forming the layers of the electromagnetic shielding sheet 1 of the present invention will be described.

Conductive Structure: The conductive structure 109 for shielding electromagnetic radiation has the metal layer 21 formed of a metal having a conductivity sufficient for shielding electromagnetic radiation, such as gold, silver, copper, iron, aluminum, nickel or chromium. The metal layer 21 may be a single layer or a laminated layer, and may be formed of an alloy. Iron base metals suitable for forming the metal layer 21 are low-carbon steels, such as low-carbon rimmed steels and low-carbon aluminum-killed steels, Ni—Fe alloys, and Invar. When cathodic electrodeposition is used, copper or copper alloy foils are desirable. The copper foils may be rolled copper foils and electrolytic copper foils. Electrolytic copper foils are preferable because electrolytic copper foils have a uniform thickness, have a satisfactory property to adhere to blackened layers and/or layers formed by a chromate treatment, and are capable of being formed in thin films of a thickness not greater than 10 μm. The thickness of the metal layer 21 is in the range of about 1 to about 100 μm, preferably, in the range of 5 to 20 μm. Although the metal layer 21 can be easily processed by photolithography to form the meshed structure if the thickness of the metal layer 21 is less than the lower limit of the thickness range, a meshed structure formed by processing the metal layer 21 having such a small thickness has a large electrical resistance that reduces the electromagnetic shielding effect. If the metal layer 21 has a thickness greater than the upper limit of the thickness range, a desired fine meshed structure cannot be formed and, consequently, the meshed structure has a low real ratio of open area and a low transmittance, visual angle decreases, and the visibility of images becomes low.

Preferably, the metal layer 21 has a surface roughness Rz between 0.5 and 10 μm. The metal layer 21 reflects external light in a specular reflection mode deteriorating the visibility of images if the surface roughness thereof is below 0.5 µm even if the surface of the metal layer 21 is blackened. The adhesive and the resist cannot be uniformly spread over the entire surface of the metal layer 21, bubbles are formed in the adhesive and the resist if the surface roughness of the metal layer 21 is greater than 10 µm. The surface roughness Rz is the mean of roughness values of ten points measured by a surface roughness measuring method specified in B0601, JIS.

Blackening Treatment: The surface, facing the viewing side, of the meshed conductive structure 109 needs to be processed by a blackening treatment to improve the visibility of images and to increase contrast in images by absorbing external light, such as sunlight and light emitted by a lamp, falling on the electromagnetic shielding sheet 1. The blackening treatment roughens and/or blackens the surface of the metal layer. The blackening treatment can be achieved by any one of various methods. For example, the blackening treatment forms a metal oxide or a metal sulfide over the surface of the metal layer. If the metal layer is formed of iron, an oxide film (blackening film) of a thickness between about 1 and about 2 µm is formed by exposing the metal layer to steam of a temperature in the range of 450° C. to 470° C. for a period in the range of 10 to 20 min. An oxide film (blackening film) may be formed by chemically processing the metal layer with a chemical, such as concentrated nitric acid. If the metal layer is a copper foil, it is preferable to attach cationic particles to the metal layer by a cathodic electrodeposition process using an electrolytic solution containing sulfuric acid, copper sulfate and cobalt sulfate. The cationic particles adhering to the surface of the metal layer increases the surface roughness of the metal layer and blackens the surface of the metal layer. The cationic particles may be copper particles or copper alloy particles. Copper-cobalt alloy particles are preferable.

In this specification, the blackening treatment includes roughening and blackening. Preferably, a preferable blackening density is 0.6 or above. Blackening density is measured by using COLOR CONTROL SYSTEM GRETAG SPM100-11® (Kimoto Co.). Measurement of the blackening density of a specimen uses an angle of observation field of 10°, a light source D50, and an illumination type T specified in the ANSI standards. Preferably, the reflectance of the surface processed by the blackening treatment is 5% or below. Reflectance is measured by using Haze Meter HM150® (Murakami Sikisai) by a method specified in K7105, JIS.

Alloy Particles: The cationic particles may be copper particles or copper alloy particles. Preferably, the cationic particles are copper-cobalt alloy particles. Copper-cobalt alloy particles improve blackening degree remarkably and absorb visible light satisfactorily. The optical characteristics representing the image visibility improving effect of the electromagnetic shielding sheet are expressed by the color system "L*, a*, b*, ΔE*" specified in Z8729, JIS. The conductive structure 109 becomes more invisible when the absolute values of a* and b* are smaller. Consequently, contrast in images is enhanced and the visibility of images is improved. The effect on decreasing the values of a* and b* of the copper-cobalt alloy particles, as compared with that of copper particles, is high. The copper-cobalt alloy particles are able to reduces the values of a* and b* near to zero.

Preferably, the mean particle size of the copper-cobalt alloy particles is in the range of 0.1 to 1 µm. Copper-cobalt alloy particles having a mean particle size exceeding the upper limit of the desired range reduces the thickness of the metal layer 21 excessively and, consequently, it is possible that the copper foil is broken in laminating the same to the base 11, and the surface of the metal layer 21 lacks fineness and has an uneven appearance because the particles are not formed compactly. Copper-cobalt particles having a mean particle size below the lower limit of the range lack roughening effect and hence the visibility of images is unsatisfactory.

Antirust Layer: The antirust layer 25A and/or the antirust layer 25B is formed at least on the blackened layer formed by blackening the metal layer 21 to prevent the metal layer 21 and/or the blackened layers from rusting and to prevent the blackened layers from coming off and being deformed. The antirust layers 25A and 25B may be layers of oxides of nickel and/or zinc and/or copper or layers formed by a chromate treatment. The layers of oxides of nickel and/or zinc and/or copper can be formed by a known plating process. The thickness of the layers of oxides of nickel and/or zinc and/or copper is in the range of about 0.001 to about 1 µm, preferably, in the range of 0.001 to 0.1 µm.

Chromate Treatment: The chromate treatment treats a workpiece with a chromating solution. The chromating solution may be applied to the workpiece by a roll-coating method, a curtain-coating method, a squeeze-coating method, an electrostatic atomization method or a dipping method. The workpiece treated by the chromate treatment is dried without rinsing. A roll-coating method is preferable when only one of the surfaces of the workpiece is to be treated by the chromate treatment. A dipping method is preferable when both the surfaces of the workpiece are to be treated by the chromate treatment. Usually, the chromating solution is a $CrO_2$ solution having a $CrO_2$ concentration of 3 g/l. A chromating solution obtained by adding an oxycarboxylic compound to a chromic anhydride solution to reduce part of hexavalent chromium into tervalent chromium may be used. The surface of the workpieces treated by the chromate treatment is colored in a color of a color category including light yellow and yellowish brown depending on the amount of deposited hexavalent chromium. Since tervalent chromium is colorless, a film formed by the chromate treatment has practically acceptable transparency when the ratio between the respective amounts of tervalent chromium and hexavalent chromium is controlled properly. Suitable oxycarboxylic compounds are tartaric acid, malonic acid, citric acid, lactic acid, glycolic acid, glyceric acid, tropic acid, benzilic acid and hydroxyvalerianic acid. Those chemicals may be used individually or in combination. Since the different compounds have different reducing effects, the amount of the compound added to the chromic anhydride solution must be determined according to the rate of reduction of hexavalent chromium into tervalent chromium. The chromate treatment applied to the blackened layer has an effect of enhancing the effect of blackening in addition to an antirust effect. Thus, the chromate treatment is a blackening emphasizing treatment.

The blackened layer and the antirust layer may be formed at least on the surface on the viewing side. Contrast is improved to improve the visibility of displayed images. The blackened layer and the antirust layer may be formed on the other surface on the side of the display to shield stray light emitted by the display and thereby the visibility of images is improved.

Subsequently, the transparent base 11 is bonded to the metal layer (the conductive structure) provided with the antirust layer and treated by the blackening process with an adhesive.

Base: The base 11 may be formed of any one of various materials, provided that the materials have desired transparency, desired insulating property, desired heat resistance and desired mechanical strength. Suitable materials for forming the base 11 are, for example, polyester resins including polyethylene terephthalate resins, polybutylene terephthalate resins, polyethylene naphthalate resins, polyethylene terephthalate-isophthalate copolymers, terephthalate-cyclohexanedimethanol-ethylene glycol copolymers and polyethylene terephthalate/polyethylene naphthalate resins for coextrusion, polyamide resins including nylon 6, nylon 66 and nylon 610, polyolefin resins including polypropylene resins and poly(methyl pentene) resins, vinyl resins including polyvinyl chloride resins, acrylic resins including polyacrylate resins, polymethacrylate resins and poly(methylmethacrylate) resins, imide resins including polyimide resins, polyamidimide resins and poly(etherimide) resins, engineering plastics including polyarylate resins, polysulfone resins, poly(ether sulfone) resins, polyphenylene ether resins, polyphenylene sulfide resins (PPSs), polyaramid resins, poly(ether ketone) resins, polyether nitrile resins, poly(ether ether ketone) resins and polyether sulfide resins, and styrene resins including polycarbonate resins and polystyrene resins.

The base may be formed of a copolymer containing some of the foregoing resins as principal components, a mixture of some of the foregoing resins or an alloy of some of the foregoing resins. The base may be a laminated sheet. Although the base may be either an oriented film or an unoriented film, it is preferable, in view of mechanical strength, that the base is a uniaxially oriented film or a biaxially oriented film. The thickness of the base is in the range of about 12 to about 1000 µm, preferably, in the range of 50 to 700 µm. The most desirable thickness of the base is in the range of 100 to 500 µm. If the base is excessively thin, the base has an insufficient mechanical strength and warps or sags. If the base is excessively thick, the base 11 has an over quality and is uselessly expensive.

The base is a film, a sheet or a board having at least one layer of one of those resins. In this specification, a film, a sheet and a board will be referred to inclusively as "film". Polyester films, such as polyethylene terephthalate films and polyethylene naphthalate films, are suitable films as the base because polyester films are satisfactory in transparency and heat resistance and inexpensive. Polyethylene terephthalate films are most suitable. Although films having higher transparency are more desirable, films having a transparency of 80% or above are acceptable.

The surface of the base may be altered by surface treatment to render the surface receptive to the adhesive layer. The surface treatment may be corona discharge treatment, plasma treatment, ozone treatment, flame treatment, coating with a primer, i.e., anchoring agent, adhesion promoting agent or adhesive receptivity improving agent, preheating, dust removing treatment, deposition treatment or alkali treatment. When necessary, the resin film may contain additives, such as a filler, a plasticizer and an antistatic agent.

Laminating Process: The laminating process forms an adhesive layer on one of the surfaces of the base 11 or the conductive structure 109, dries the adhesive layer when necessary, and applies pressure to a laminated structure formed by superposing the base 11 and the conductive structure 109 either heating or not heating the laminated structure. The laminated structure may be subjected to aging at a temperature in the range of 30° C. to 80° C. if necessary. If the base 11 is formed of a resin that becomes adhesive when heated, such as an ionomer, an ethylene-vinyl acetate copolymer or an ethylene acrylate copolymer, or if the base 11 is a laminated film having a layer formed of such a resin, the base 11 and the conductive layer 109 can be laminated without using any adhesive simply by superposing the base 11 and the conductive structure 109 and applying pressure to the superposed base 11 and the conductive structure 109 under heat. The metal layer 21 can be directly formed on the base by electroless plating or vacuum deposition without using any adhesive.

Adhesive: Any suitable adhesive may be used. Suitable adhesives are, for example, acrylic resins, polyester resins, urethane resins, and polyvinyl chloride-acetate resins. Dry lamination using a thermosetting resin having satisfactory processability and resistant to the coloring and deteriorative effects of an etchant is preferable. A UV-curable resin curable by irradiation with ionizing radiation, such as UV radiation, is preferable.

Dry Lamination: A dry lamination process for laminating two films forms adhesive layers on the films by applying an adhesive solution prepared by dissolving an adhesive in a solvent to the films and drying the adhesive solution, laminates the films to form a laminated film, subjects the laminated film to aging at a temperature in the range of 30° C. to 120° C. for several hours to several days to cure the adhesive. A nonsolvent lamination process developed by improving the dry lamination process may be employed. The nonsolvent lamination process spreads an adhesive instead of the adhesive solution over films, dries the adhesive, laminates the films in a laminated film and subjects the laminated structure to aging at a temperature in the range of 30° C. to 120° C. for several hours to several days to cure the adhesive so that the films are bonded together.

An adhesive suitable for the dry lamination process or the nonsolvent lamination process is a thermosetting adhesive or an ionizing-radiation-curable adhesive that can be cured with ionizing radiation, such as UV radiation or electron beams. Suitable thermosetting adhesives are two-part adhesives, such as urethane adhesives including polyester-urethane adhesives, polyether-urethane adhesives and acryl-urethane adhesives, acrylic adhesives, polyester adhesives, polyamide adhesives, polyvinyl acetate adhesives, epoxy adhesives and rubber adhesives. Two-part urethane adhesives are preferable.

A suitable two-part urethane adhesive is, for example, a polymer obtained through the reaction of a polyfunctional isocyanate with a hydroxyl-terminated compound. Suitable polyfunctional isocyanates are, for example, aromatic (or alicyclic) polyisocyanates, such as tolylenediisocyanate, diphenylmethane diisocyanate and poly(methylene-phenylene) polyisocyanate or polyfunctional isocyanates, such as aliphatic (or alicyclic) polyisocyanates including hexamethylene diisocyanate, xylylene di-isocyanate isophorone diisocyanate. Those polyisocyanates may be polymers (trimers) and addition polymers of those isocyanates. Suitable hydroxyl-terminated compounds are polyether polyol, polyester polyol and polyacrylate polyol. A two-part urethane resin obtained by reacting polyfunctional isocyanate with a hydroxyl-terminated compound may be used.

Preferable adhesive is obtained by mixing a polyester polyurethane resin denatured by a styrene-maleic acid copolymer resistant to the coloring and deteriorative effects of an etchant, and an aliphatic polyisocyanate resin.

The dry lamination process dissolves or disperses an adhesive composition containing the foregoing materials as principal components in an organic solvent to produce an adhesive liquid, coats a film with a film of the adhesive liquid by a coating method, such as a roll coating method, a reverse-roll coating method, a gravure roll coating method, a gravure reverse-roll coating method, a gravure offset coating method, a kiss coating method, a wire bar coating method, a comma coating method, a knife coating method, a dip coating method, a flow coating method or a spray coating method, and removes the solvent by drying the film of the adhesive liquid to form an adhesive layer for dry lamination. A roll coating method or a reverse-roll coating method is preferable.

The thickness of the dry adhesive layer is in the range of about 0.1 to about 20 μm, preferably, in the range of 1 to 10 μm. The base is laminated to the conductive structure immediately after the formation of the adhesive layer, and a laminated structure thus formed is subjected to aging at a temperature in the range of 30° C. to 120° C. for several hours to several days to cure the adhesive layer so that the base and the conductive structure are bonded together. The adhesive layer may be formed on either the base or the conductive structure. Preferably, the adhesive layer is formed on the copper foil so as to cover the roughened surface of the copper foil entirely to prevent formation of bubbles in the laminated structure.

Although the nonsolvent lamination process and the dry lamination process are basically the same, the nonsolvent lamination process uses the adhesive composition directly without dissolving or dispersing the adhesive composition in a solvent. When necessary, the adhesive composition is heated to decrease the viscosity of the adhesive composition.

Adhesive: The adhesive may be a known pressure-sensitive adhesive. There are not particular restrictions on the adhesive. The adhesive may be any one of suitable resins. Suitable adhesives are natural rubber, synthetic rubbers including butyl rubbers, polyisoplene rubbers, polyisobutylene rubbers, polychloroprene rubbers and styrene-butadiene copolymers, silicone resins including dimethyl polysiloxane resins, acrylic resins, vinyl acetate resins including polyvinyl acetate resins and ethylene-vinyl acetate copolymers, urethane resins, acrylonitrile resins, hydrocarbon resins, alkylphenol resins, and rosin resins including rosin, rosin triglyceride reins and hydrogenated rosin.

Rubber Adhesive: Effective rubber adhesives are mixtures each of one or some of adhesives including chloroprene rubber, acrylonitrile-butadiene rubber, acrylic rubber, styrene-butadiene rubber, styrene-isoprene-styrene rubber, styrene-butadiene-styrene rubber, styrene-ethylene-butadiene rubber, butyl rubber, polyisobutylene rubber, natural rubber and polyisoprene rubber, and one or some of tackfiers including phenol resins, modified phenol resins, ketone resins, alkyd resins, rosin resins, coumarone resins, styrene resins, petroleum resins and vinyl chloride reins.

The rubber adhesives are superior to acrylic adhesives in chemical resistance, swelling resistance, heat resistance, tackiness and peeling strength. Therefore, layers bonded with the rubber adhesive will not peel off even if the same are exposed to acid or alkali solutions. The rubber adhesive is scarcely subject to hydrolysis in acid or alkali solutions, and maintains its adhesive property for a long time.

Adhesive Layer: A latex, an aqueous dispersion or an organic solution of one or some of the foregoing resins is spread in an adhesive film on the surface of one of two layers to be bonded together by a known printing method, such as a screen printing method or a comma coating method, or a known coating method, the adhesive film is dried when necessary, and then the other layer is pressed against the former layer.

Figure 5A:
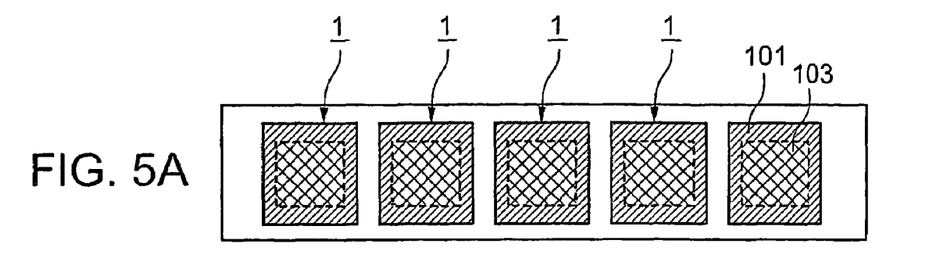
FIG. 5A is a plan view of assistance in explaining a method of processing a rolled continuous film.
Figure 5B:
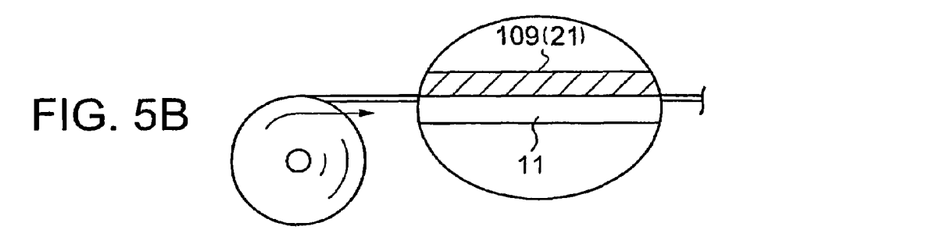
FIG. 5B is a partly enlarged side elevation of assistance in explaining the method of processing a rolled continuous film.

FIGS. 5A and 5B are a plan view and a side elevation, respectively, of assistance in explaining a method of processing a rolled continuous film.

A roll of a continuous film is used for forming laminated structures. In FIG. 5, the electromagnetic shielding sheets 1 are formed at predetermined intervals on the continuous film unwound from a roll. FIG. 5B shows the conductive structure 109 including the metal layer 21 and laminated to the base 11. The conductive structure 109 is formed by forming the blackened layers, the antirust layers and the metal layer 21 on the continuous film unwound from a roll. The adhesive layer is formed on the antirust layer of the conductive structure 109 by spreading an adhesive in an adhesive film to the surface of the antirust layer and drying the adhesive film. The conductive structure 109 is bonded to the base 11 by pressing the same against the base 11. When necessary, a laminated structure formed by bonding together the conductive structure 109 and the base 11 is aged (cured) at a temperature in the range of 30° C. to 80° C. for several hours to several days, and the laminated structure is wound in a roll.

Photolithography: A resist film having a predetermined meshed pattern is formed on the conductive structure 109 of the laminated structure, parts of the conductive structure 109 not coated with the resist film are removed by etching, and the resist film is removed to complete a meshed conductive structure.

Masking: The conductive structures of the continuous laminated structure formed by bonding together the base 11 and the conductive structures 109 and unwound from a roll are processed by photolithography to form meshed conductive structures 109. The continuous laminated structure is processed for masking, etching and resist film removal while the same is kept taut and fed continuously or intermittently.

Masking forms, for example, a photoresist film over the entire surface of the conductive structure 109, dries the photoresist film, puts a mask having a predetermined pattern on the photoresist film, exposes the photoresist film through the mask in the predetermined pattern of lines defining meshes, develops the exposed photoresist film, treats the developed photoresist film by a hardening treatment and bakes the patterned photoresist film.

The resist film is formed on the surface of the conductive structure 109 by applying the photoresist, such as casein, a PVA or gelatin, to the surface of the conductive structure 109 by a dipping method, a curtain coating method or a flow coating method while the laminated structure formed by laminating the base 11 and the conductive structures 109 is unwound from a roll and fed continuously or intermittently. The resist film may be formed by attaching a dry resist film to the conductive structure 109 instead of applying the liquid resist to the conductive structure 109. The baking temperature is in the range of 200° C. to 300° C. when a casein resist is used. It is preferable to bake the laminated structure at the lowest possible temperature to prevent the laminated structure from warping.

Etching Process: The resist film is etched after masking the same with the mask. A ferric chloride solution and a cupric chloride solution, which are easy to circulate, are preferable for a continuous etching process. Basically, the etching process is similar to an etching process using a shadow mask forming system for etching a continuous thin steel sheet of a thickness in the range of 20 to 80 μm to form shadow masks for CRTs of color TV sets. The etching process can be carried out by an existing shadow mask forming system, and a series of steps from a masking step to an etching process can be very efficiently continuously carried out. The laminated structure is washed with water, the resist film is removed with an alkali solution, the laminated structure is washed again, and then the laminated structure is dried.

Meshed Structure: The meshed structure 103 has the lines 107 defining the openings 105. There are not particular restrictions on the shape of the openings 105. The openings 105 may have a triangular shape, such as the shape of an equilateral triangle or an isosceles triangle, a quadrilateral shape, such as the shape of a square, a rectangle, a rhombus or a trapezoid, a polygonal shape, such as the shape of a pentagon, a hexagon or an octagon, a circular shape or an elliptic shape. The openings 105 form a mesh.

A pattern plate is meshed in a pattern, in view of meeting requirements concerning ratio of open area, mesh invisibility and image visibility, such that the width W (FIG. 2) of parts of the pattern corresponding to the straight parts of the lines 107 of the meshed structure 103 is within C(1±30%), where C is a predetermined value. Preferably, the width W is within C(1±20%), more preferably, within C(1±10%). Conditions for the etching process are controlled to form the meshed structure 103 having the lines 107 of widths within the range of C(1±30%). As sown in FIG. 7, the radius r of curvature of a side surface extending between the upper side 107U and the lower side 107B of a section of the lines 107 in a plane perpendicular to the transparent base is in the range of 1.5 to 3.0 times the thickness t of the metal layer ($1.5t \leq r \leq 3.0t$). Preferably, the width W of the lines 107 of the meshed structure 103 is between 5 and 25 μm, and the pitches between the lines 107 are between 150 and 500 μm.

Generally, an electromagnetic shielding sheet for a large plasma display panel has thousands of intersecting straight lines. The lines 107 are formed such that the widths thereof are distributed within a desired width range, and the radius of the side surface of a bank extending between the upper and the lower side of a section of the lines 107 is controlled. The electromagnetic shielding sheet 1 meeting those conditions has an electromagnetic shielding ability, a proper transparency, uniformly arranged meshes, a few black and white spot defects and linear defects, a surface that does not glare or suppresses the reflection of external light, and enables images to be seen in excellent visibility.

The range of distribution of widths of the lines 107 having, for example, a nominal line width of 14 μm is 14±4.2 μm, i.e., between 9.8 and 18.2 μm. When the widths of the lines 107 are within this range, the lines 107 do not form meshes in an irregular density, and do not form undesirable black and/or white spot defects and linear defects. If the widths of the lines 107 are distributed in an excessively wide width range, the meshes are formed in an irregular mesh density. Parts, in which the lines 107 have an excessively wide width, of the electromagnetic shielding sheet form undesirable black spot defects, and parts, in which the lines 107 have an excessively narrow width, of the electromagnetic shielding sheet form undesirable white spot defects. White and/or black spot defects make the viewer feel a very strong feeling of wrongness.

The laminated structure 103 of the electromagnetic shielding sheet 1 of the present invention is formed by a continuous photolithographic process, has the lines having widths within the predetermined width range. Therefore, meshes of the meshed structure 103 are not formed in an irregular mesh density, and the electromagnetic shielding sheet 1 has a satisfactory electromagnetic shielding ability and a proper transparency. The irregular mesh density, the black and/or white spot defects and the linear defects are formed if a spray of the resist adheres to parts other than those to be coated with the resist. Such a trouble rarely occurs in the continuous photolithographic process.

A peripheral part contiguous with the circumference of the meshed structure 103 may be excluded from those for which the width W of the lines 107 is controlled. That is, the grounding frame 101 formed of the metal layer 21 and surrounding the meshed structure 103 does not have any lines 107 and, in some cases, end parts of the lines 107 in the peripheral part are widened toward the grounding frame 101. The width of the peripheral part of the meshed structure 103 corresponds to between 1 and 50 meshes or is between 0.15 and 15 mm, preferably, corresponds to between 1 and 25 meshes or is between 0.3 and 7.5 mm.

A suitable resist is selected and conditions of the etching process are determines so as to form the lines 107 such that the radius r of curvature of a side surface 107S extending between the upper side 107U and the lower side 107B of a bank in a section of the lines 107 in a plane perpendicular to the transparent base is in the range of 1.5 to 3.0 times the thickness of the metal layer and the width W of the lines 107 is within the range of C(1±30%), where C is a predetermined value. For example, it is desirable that a dry resist or a liquid resist is used, an etchant having a Baumé degree of 35° or above is used, a ferric chloride solution or a cupric chloride solution heated at 35° C. or above is used as the etchant, the etchant is splayed at a spraying rate of 2000 ml/min or above, and a spray nozzle is oscillated in a vertical or horizontal plane.

The radius of curvature and the line width of the lines can be easily controlled by forming the lines of the pattern in an accuracy of ±30% or higher, forming the lines of the pattern in a width greater than the line width of the lines 107 to increase the amount of parts to be etched and etching the laminated structure 109 at a low etch rate.

The radius of curvature of a side surface extending between the upper and the lower side of a bank is estimated from the lengths of sides of an electron micrograph, taken at a 2000× magnification, of the line 107 in a specimen obtained by slicing the electromagnetic shielding sheet in a plane perpendicular to the transparent base with a microtome in a slice, and coating the slice with a platinum-palladium alloy by sputtering. The section of banks formed by etching does not necessarily have a truly circular shape. The line representing the side surface of the bank may be a line similar to the circumference of a substantially circular shape or an inclined side of a trapezoid.

In brief, it is desired that the radius of curvature of a curve extending between the respective right ends of the upper and the lower side or a curve extending between the respective left ends of the upper and the lower side is between 1.5 and 3.0 times the thickness of the metal layer. The radius of curvature does not necessarily need to be fixed and may be varied, provided that the same is within the range of 1.5 to 3.0 times the thickness of the metal layer.

Although the lines shown in FIG. 1 are bias lines inclined to the lower side of the electromagnetic shielding sheet at 45°, the angle of the lines to the lower side is not limited thereto and may be selectively determined taking into consideration the light emitting characteristic of the associated display and the arrangement of pixels to prevent the formation of moiré.

Flattening: the lines 107 of the meshed structure have a height corresponding to the thickness of the metal layer 21, and parts of the metal layer 21 are removed to form the openings 105. The openings 105 are recesses surrounded by the lines 107. Thus, the conductive structure 109 has an irregular surface. When an adhesive (or a pressure-sensitive adhesive) is applied to the irregular surface of the conductive structure 109 by the next process, the openings 105 are filled up with the adhesive. It often occurs that air filling up the openings 105 is not completely replaced with the adhesive and bubbles are formed in the adhesive filling up the openings 105. The interfaces between the bubbles and the adhesive scatter light to increase haziness (or cloudiness). Therefore, it is desirable to flatten the surface of the conductive structure 109 by filling up the recesses with a transparent resin to prevent such a problem.

The recesses are filled up with a transparent resin for flattening. Bubbles are contained in the transparent resin to decrease transparency unless the recesses are filled up completely with the transparent resin. Therefore, a transparent resin diluted with a solvent and having a low viscosity is applied to the surface of the conductive structure 109 in a resin film, and the resin film is dried to form the flattening layer 29, or the resin is applied to the surface of the conductive structure 109, deaerating the same to form the flattening layer 29.

The flattening layer 29 may be formed of any suitable resin, provided that the resin has a high transparency, and sufficiently adhesive to the metal forming the meshed structure and to an adhesive to be used by the next process. If projections or recesses are formed in the surface of the flattening layer 29 and the surface of the flattening layer 29 undulates, moiré, interference fringes and/or Newton rings are formed when the electromagnetic shielding sheet is disposed in front of a display. It is preferable to apply a thermosetting or UV-curable resin diluted by a solvent and having a low viscosity to the conductive structure 109 so that the recesses forming the openings 105 are filled up completely and a resin layer is formed, to remove the solvent from the resin layer by drying, to attach a flat release sheet to the surface of the resin layer, to cure the resin layer by heating or irradiation with UV radiation, and to remove the release sheet from the cured resin layer. The flat surface of the release sheet is transferred to the flattening layer 29 to form a flat surface.

The flattening layer 29 may be formed of any suitable resin, such as a natural resin, a synthetic resin, a thermosetting resin or an ionizing-radiation-curable resin. In view of durability, applicability and flattening property, suitable materials for forming the flattening layer 29 are UV-curable acrylic resins.

Near-infrared absorbing Layer: The resin forming the flattening layer 29 may contain a near-infrared absorbing agent capable of absorbing near-infrared radiation in a specific wave band. An unpleasant feeling caused by displayed images is suppressed and the visibility of displayed images is improved by absorbing visible and/or infrared radiation in a specific wave band. The specific wave band of the wavelengths of near-infrared radiation is between about 780 and about 1200 nm, more strictly, between 800 and 1100 nm. It is desirable to absorb 80% or above of near-infrared radiation having wavelengths in a wave band of 800 to 1000 nm. Although any suitable near-infrared absorbing agent may be used, a suitable near-infrared absorbing agent is, for example, a coloring matter having peak electromagnetic absorption wavelengths in the near-infrared wave band, a high light transmittance in the visible region and not having a specific peak electromagnetic absorption wavelength in the visible region. Usually, visible light emitted by a PDP contains a large amount of orange light having a spectrum corresponding to the emission spectrum of neon atoms. Therefore, it is desirable that the flattening layer 29 contains a color tone correcting light-absorbing agent that absorbs some of visible light having wavelengths in the range of about 570 to about 605 nm. Coloring matters meeting such a requirement include cyanine compounds, phthalocyanine compounds, naphthalocyanine compounds, naphthoquinone compounds, anthraquinone compounds, dithiol complexes, ammonium compounds and di-ammonium compounds. Suitable color tone correcting light absorbing agents are azo compounds and phthalocyanine compounds. Although the flattening layer 29 contains the near-infrared absorbing agent in this embodiment, a near-infrared absorbing layer containing a near-infrared absorbing agent may be formed on at least one of the surfaces of the conductive structure 109.

Near-infrared absorbing Layer: Near-infrared-absorbing layers are formed on the surfaces of the flattening layer 29 and the base 11, or a near-infrared absorbing layer is formed on the surface of the flattening layer 29 or the base 11. A near-infrared absorbing layer 31A is formed on the base 11 as shown in FIG. 1. A near-infrared absorbing layer 31B is formed on the surface of the flattening layer 29 as shown in FIG. 1. The near-infrared absorbing layers 31A and 31B may be near-infrared absorbing films on the market, such as Film No. 2832 commercially available from Toyobo, bonded to the base 11 and the flattening layer 29 with an adhesive or may be films of a binder containing the aforesaid near-infrared absorbing agent. Suitable binders include polyester resins, polyurethane resins, acrylic resins and thermosetting or UV-curable resins utilizing the reaction of epoxy groups, acrylate groups, methacrylate groups or isocyanate groups.

Antireflection Layer: An antireflection layer, not shown, may be formed on a surface, on the viewing side, of the electromagnetic shielding sheet. The antireflection layer prevents reflecting visible light. There are various commercially available single-layer and multiple-layer antireflection films. A multiple-layer antireflection film consists of alternate high-diffraction and low-diffraction layers. Suitable high-diffraction layers are those of niobium oxide, titanium oxide, zirconium oxide and ITO. Suitable low-diffraction layers are those of silicon oxide, magnesium fluoride and such. Some antireflection film has a layer having a minutely roughened surface that reflects external light in a diffused reflection mode.

Hard Coating Layer, Antifouling Layer, Antiglare Layer:

A hard Coating layer, an antifouling layer and an antiglare layer may be formed on the antireflection layer. The hard coating layer has a hardness not lower than a hardness H determined by a pencil hardness test method specified in K 5400, JIS. The hard coating layer is formed by heating or irradiating with ionizing radiation a film of a polyfunctional acrylate resin, such as a polyester (meth)acrylate resin, a urethane (meth)acrylate resin or an epoxy (meth)acrylate resin. The antifouling layer is a water-repellent, oil-repellent coating of a siloxane compound or a fluorinated alkylsilyl compound. The antiglare layer has a minutely roughened surface capable of reflecting external light in a diffused reflection mode.

Cutting: A continuous base sheet on which electromagnetic shielding structures are formed is unwound from a roll and the continuous base sheet is cut to provide individual electromagnetic shielding sheets 1. A front plate for a display is formed by attaching the electromagnetic shielding sheet 1 to a transparent substrate, such as a glass substrate. When necessary, an antireflection layer, a hard coating layer, an antifouling layer and/or an antiglare layer is laminated to the electromagnetic shielding sheet 1 to form a front panel for a display. A rigid transparent substrate of a thickness in the range of 1 to 10 mm is used for forming a front panel for a large display. A plastic film of a thickness in the range of 0.01 to 0.5 mm is used as a transparent substrate for forming a front panel for a small display, such as a character indicator or the like. Thus, a proper transparent substrate is used selectively according to the size and use of the display. The electromagnetic shielding sheet 1 may be directly applied to the screen of a display.

Figure 6:
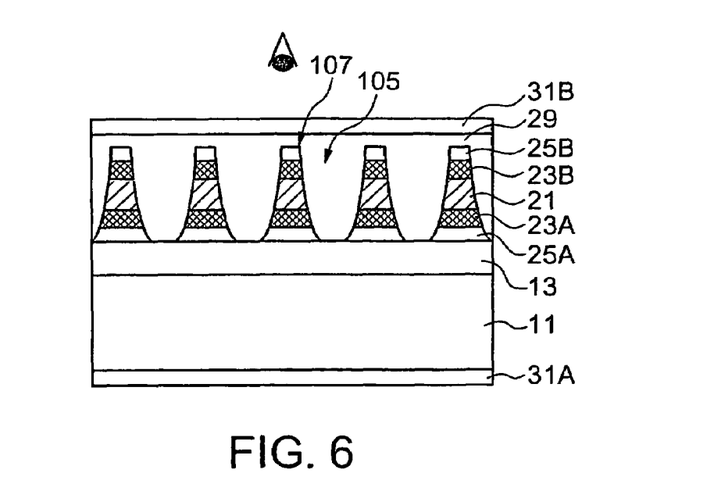
FIG. 6 is a sectional view of an electromagnetic shielding sheet according to the present invention to be applied to the screen of a display.

FIG. 6 is a sectional view of an electromagnetic shielding sheet in another embodiment of the present invention, corresponding to a section taken on the line A-A in FIG. 2. This electromagnetic shielding sheet is intended to be applied to the screen of a display Direct Application: The electromagnetic shielding sheet 1 is attached to the screen of a display with the meshed metal layer 21 facing the viewing side, and at least a blackened layer and an antirust layer are formed on the metal layer 21. When the electromagnetic shielding sheet 1 is thus attached to the display, the grounding frame 101 is exposed and can be easily connected to a ground. Since the grounding frame 101 is processed by the blackening process and faces the viewing side, the front glass plate does not need any printed, black frame, which reduces processes and has an advantageous effect on cost reduction.

Example 1

A conductive structure was formed by subjecting a 10 μm thick electrolytic Cu foil to a blackening process that forms a blackened layer consisting of Cu—Co alloy particles having a mean particle size of 0.3 μm and a chromating treatment that forms a chromated layer in that order. A 100 μm thick transparent, biaxially oriented PET film A4300® (Toyobo) as a base was laminated to the blackened layer of the Cu foil with a two-part polyurethane adhesive. A structure formed by laminating the PET film and the Cu foil was aged at 56° C. for four days. The two-part adhesive includes TAKERAKKU A-310® (polyol) (Takeda Yakuhin Kogyo) as an adhesive resin, and Hardener A-10® (isocyanate) (Takeda Yakuhin Kogyo) as a hardener. The two-part adhesive was spread in a 7 μm thick film in a dry state.

The structure formed in a continuous laminated film was masked and etched by a photolithographic process. The photolithographic process was carried out by a shadow mask manufacturing line for manufacturing shadow masks for color TV sets. A photoresist film of casein was formed over the entire surface of the conductive structure of the laminated film by a flow coating method. The laminated film was delivered to the next station. The laminated structure was exposed to light emitted by a mercury lamp through a photomask having a pattern for forming 22±1 μm wide lines defining square openings, arranged at pitches of 300 μm and inclined at 49°, and 5 mm wide grounding parts. The laminated structure was processed at the following stations for developing, hardening and burning at 80° C.

Subsequently, parts of the Cu foil and those of the blackened layer corresponding to the openings were removed by a spray etching process using a ferric chloride solution heated at 40° C. and having a Baumé degree of 40° as an etchant by a spray etching method having a side etching effect. The laminated film was processed by the following processes at the following stations for washing, resist film removal, rinsing and drying at 80° C. to complete electromagnetic shielding sheets in Example 1.

Example 2

Electromagnetic shielding sheets in Example 2 were formed by the same method as that of forming the electromagnetic shielding sheets in Example 1, except that the former method used a ferric chloride solution having a Baumé degree of 35° as an etchant.

Comparative Example 1

Electromagnetic shielding sheets in Comparative example 1 were formed by the same method as that of forming the electromagnetic shielding sheets in Example 1, except that the former method used a dry resist film and etched the parts of the Cu foil and those of the blackened layer corresponding to the openings by a flow etching process using a ferric chloride solution having a Baumé degree of 20° as an etchant.

Example 3

Electromagnetic shielding sheets in Example 3 were fabricated by the steps of coating the surfaces of the meshed structures of the electromagnetic shielding sheets in Example 1 with a film of a flattening composition, laminating a 50 μm thick SP-PET20-BU® (Tosero), i.e., a PET film having a surface having a release characteristic, to the surface of the film of the flattening composition, exposing the thus coated electromagnetic shielding sheets to radiation of an intensity of 200 mj/cm$^2$ (in terms of 365 nm) emitted by a high-pressure mercury lamp, and removing the SP-PET20-BU. The electromagnetic shielding sheets in Example 3 had a flattening layer of the flattening composition filling up the openings of the meshed structures.

The flattening composition was prepared by mixing 20 parts by mass of N-vinyl-2-pyrrolidone, 25 parts by mass dicyclopentenyl acrylate, 52 parts by mass oligoester acrylate (M-8060®, Toa Gosei), and 3 parts by mass 1-hydroxycyclohexyl phenylketone (IRUGACURE 184, ciba-Geigy).

Example 4

Electromagnetic shielding sheets in Example 4 were the same as those in Example 21, except that the electromagnetic shielding sheets in Example 4 had a flattening layer formed of a material prepared by adding one part by mass thiol-nickel complex, i.e., a near-infrared absorbing agent, Example 5

Electromagnetic shielding sheets in Example 5 were the same as those in Example 2, except that NIR Film No. 2832® (Toyobo), i.e., a near-infrared absorbing film, was laminated to the flattening layer with an adhesive.

Example 6

Direct Attachment

Electromagnetic shielding sheets in Example 6 were the same as those in Example 1, except that a PET film was attached to a surface not processed by a chromate treatment for forming a layer of Cu—Co alloy particles and a flattening layer was formed by the same method as that of forming the flattening layer of the electromagnetic shielding sheets in Example 3.

Evaluation

The line width, the respective widths of the upper and the lower side of randomly selected 100 sections of the lines were determined by measuring corresponding dimensions in micrographs of the sections, taken at a 400× magnification, of the line 107. The density distribution of the meshes was evaluated through visual observation. The visibility of images was evaluated through the visual observation of displayed images through the electromagnetic shielding sheet attached to the screen of the PDP. The radius of curvature of the side surface was determined through the measurement of the corresponding dimension in an electron micrograph taken at a 2000× magnification of a specimen.

Results of Evaluation

In the electromagnetic shielding sheet in Example 1, the line widths of the lines were in the range of 8 to 12 μm, which was within C(1±20%), the distribution of mesh density was uniform, the radius of curvature of the side surface of the bank was 30 μm (3.0 times the thickness of the conductive structure), images displayed by the PDP did not glare, and the visibility of the displayed images was satisfactory.

In the electromagnetic shielding sheet in Example 2, the line widths of the lines were in the range of 7 to 13 µm, which was within C(1±20%), the distribution of mesh density was uniform, the radius of curvature of the side surface of the bank was 15 µm (1.5 times the thickness of the conductive structure), images displayed by the PDP did not glare, and the visibility of the displayed images was satisfactory.

In the electromagnetic shielding sheet in Comparative example 1, the radius of curvature of the side surface of the bank was 10 µm (1.0 times the thickness of the conductive structure), images displayed by the PDP glared, the line widths of the lines were in the range of 9 to 19 µm, which was outside the desired range of C(1±30%), and the distribution of mesh density was irregular.

The electromagnetic shielding sheets in Examples 3 to 5 were attached to the front surface of the PDP, solid white and solid black images were displayed by the PDP and the solid white and the solid black image were visually observed. The surface of the PDP did not glare, any white and/or black spot defects and any linear defects were not found, and the visibility was excellent.

When the electromagnetic shielding sheet in Example 6 was put on the PDP with the base thereof bonded to the surface of the PDP with an adhesive, only a little stray light was produced by reflecting light emitted by the PDP, the PDP did not glare and the visibility of images displayed by the PDP was satisfactory, work for grounding the electrode was reduced and the glass substrate did not need any printed black frame.

The electromagnetic shielding sheets of the present invention are disposed in front of displays to shield electromagnetic radiation generated by the displays, the invisible lines of the meshed structure have both an electromagnetic shielding ability and a high transparency. Since the widths of the lines are within the predetermined range, the distribution of mesh density is uniform. Since the meshed structure is formed such that the ratio of the radius of curvature of the bank in the section of the line to the thickness of the meshed structure is within the specified range, the electromagnetic shielding sheet prevents the glare of the screen of the display and improves the visibility of images.

The invention claimed is:

1. An electromagnetic shielding sheet comprising: a transparent base, and a meshed conductive structure laminated to one of the surfaces of the transparent base;
    wherein the conductive structure has lines having straight parts of a width in the range of C(1±30%), where C is a predetermined value and C(1±30%) indicates that errors in the width are distributed within ±30% from the predetermined value C, and
    wherein at least recesses in the meshed conductive structure are filled up with a transparent resin such that the surface of the conductive structure is substantially flat.

2. The electromagnetic shielding sheet according to claim 1, wherein the widths of the straight parts of the lines an inner part of the meshed conductive structure surrounded by a peripheral part of a width corresponding to 1 to 50 meshes or a peripheral part of a width in the range of 0.15 to 15 mm are in the range of C(1±30%), where C is a predetermined value.

3. The electromagnetic shielding sheet according to claim 1, wherein the widths of the straight parts of the lines of the conductive structure are in the range of 5 to 25 µm, and the lines are arranged at pitches in the range of 150 to 500 µm.

4. The electromagnetic shielding sheet according to claim 1, wherein the conductive structure is a metal layer.

5. The electromagnetic shielding sheet according to claim 1, wherein at least one of the surfaces of the conductive structure is processed by a blackening treatment.

6. The electromagnetic shielding sheet according to claim 5, wherein an antirust layer is formed at least on a surface, processed by a blackening treatment, of the conductive structure.

7. The electromagnetic shielding sheet according to claim 1, wherein the transparent resin filling up the recesses in the meshed conductive structure to substantially flatten the surface of the conductive structure contains a color tone correcting light-absorbing agent capable of absorbing visible light having wavelengths between 570 and 605 nm and/or a near-infrared absorbing agent capable of absorbing infrared radiation having wavelengths between 800 and 1100 nm.

8. The electromagnetic shielding sheet according to claim 1, further comprising a layer containing a color tone correcting light-absorbing agent capable of absorbing visible light having wavelengths between 570 and 605 nm and/or a layer containing a near-infrared absorbing agent capable of absorbing infrared radiation having wavelengths between 800 and 1100 nm formed on at least one of the surfaces of the conductive structure.

9. An electromagnetic shielding sheet comprising: a transparent base, and a meshed conductive structure laminated to one of the surfaces of the transparent base;
    wherein the radius of curvature of a side surface extending between the upper and the lower side of a bank in a section of the lines in a plane perpendicular to the transparent sheet is in the range of 1.5 to 3.0 times the thickness of the conductive structure, and
    wherein at least recesses in the meshed conductive structure are filled up with a transparent resin such that the surface of the conductive structure is substantially flat.

10. The electromagnetic shielding sheet according to claim 9, wherein the widths of the straight parts of the lines an inner part of the meshed conductive structure surrounded by a peripheral part of a width corresponding to 1 to 50 meshes or a peripheral part of a width in the range of 0.15 to 15 mm are in the range of C(1±30%), where C is a predetermined value.

11. The electromagnetic shielding sheet according to claim 9, wherein the widths of the straight parts of the lines of the conductive structure are in the range of 5 to 25 µm, and the lines are arranged at pitches in the range of 150 to 500 µm.

12. The electromagnetic shielding sheet according to claim 9, wherein the conductive structure is a metal layer.

13. The electromagnetic shielding sheet according to claim 9, wherein at least one of the surfaces of the conductive structure is processed by a blackening treatment.

14. The electromagnetic shielding sheet according to claim 13, wherein an antirust layer is formed at least on a surface, processed by a blackening treatment, of the conductive structure.

15. The electromagnetic shielding sheet according to claim 9, wherein the transparent resin filling up the recesses in the meshed conductive structure to substantially flatten the surface of the conductive structure contains a color tone correcting light-absorbing agent capable of absorbing visible light having wavelengths between 570 and 605 nm and/or a near-infrared absorbing agent capable of absorbing infrared radiation having wavelengths between 800 and 1100 nm.

16. The electromagnetic shielding sheet according to claim 9, further comprising a layer containing a color tone correcting light-absorbing agent capable of absorbing visible light having wavelengths between 570 and 605 nm and/or a layer containing a near-infrared absorbing agent capable of absorbing infrared radiation having wavelengths between 800 and 1100 nm formed on at least one of the surfaces of the conductive structure.

17. An electromagnetic shielding sheet comprising: a transparent base, and a meshed conductive structure laminated to one of the surfaces of the transparent base;

wherein the conductive structure has lines having straight parts of a width in the range of C(1±30%), where C is a predetermined value and C(1±30%) indicates that errors in the width are distributed within ±30% from the predetermined value C, and the radius of curvature of a side surface extending between the upper and the lower side of a bank in a section of the lines in a plane perpendicular to the transparent sheet is in the range of 1.5 to 3.0 times the thickness of the conductive structure, and wherein at least recesses in the meshed conductive structure are filled up with a transparent resin such that the surface of the conductive structure is substantially flat.

18. The electromagnetic shielding sheet according to claim 17, wherein the widths of the straight parts of the lines an inner part of the meshed conductive structure surrounded by a peripheral part of a width corresponding to 1 to 50 meshes or a peripheral part of a width in the range of 0.15 to 15 mm are in the range of C(1±30%), where C is a predetermined value.

19. The electromagnetic shielding sheet according to claim 17, wherein the widths of the straight parts of the lines of the conductive structure are in the range of 5 to 25 μm, and the lines are arranged at pitches in the range of 150 to 500 μm.

20. The electromagnetic shielding sheet according to claim 17, wherein the conductive structure is a metal layer.

21. The electromagnetic shielding sheet according to claim 17, wherein at least one of the surfaces of the conductive structure is processed by a blackening treatment.

22. The electromagnetic shielding sheet according to claim 21, wherein an antirust layer is formed at least on a surface, processed by a blackening treatment, of the conductive structure.

23. The electromagnetic shielding sheet according to claim 17, wherein the transparent resin filling up the recesses in the meshed conductive structure to substantially flatten the surface of the conductive structure contains a color tone correcting light-absorbing agent capable of absorbing visible light having wavelengths between 570 and 605 nm and/or a near-infrared absorbing agent capable of absorbing infrared radiation having wavelengths between 800 and 1100 nm.

24. The electromagnetic shielding sheet according to claim 17, further comprising a layer containing a color tone correcting light-absorbing agent capable of absorbing visible light having wavelengths between 570 and 605 nm and/or a layer containing a near-infrared absorbing agent capable of absorbing infrared radiation having wavelengths between 800 and 1100 nm formed on at least one of the surfaces of the conductive structure.

* * * * *

UNITED STATES PATENT AND TRADEMARK OFFICE
CERTIFICATE OF CORRECTION

PATENT NO. : 7,642,469 B2
APPLICATION NO. : 10/519935
DATED : January 5, 2010
INVENTOR(S) : Arakawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1302 days.

Signed and Sealed this

Sixteenth Day of November, 2010

David J. Kappos
*Director of the United States Patent and Trademark Office*